(12) United States Patent
Nyshadham et al.

(10) Patent No.: US 9,397,683 B2
(45) Date of Patent: Jul. 19, 2016

(54) REDUCED DIGITAL AUDIO SAMPLING RATES IN DIGITAL AUDIO PROCESSING CHAIN

(71) Applicants: Phani Kumar Nyshadham, Banglore (IN); Niranjan Avadhanam, Bangalore (IN); Sreekanth Nakkala, Bangalore (IN)

(72) Inventors: Phani Kumar Nyshadham, Banglore (IN); Niranjan Avadhanam, Bangalore (IN); Sreekanth Nakkala, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 31 days.

(21) Appl. No.: 14/451,820

(22) Filed: Aug. 5, 2014

(65) Prior Publication Data

US 2016/0042743 A1    Feb. 11, 2016

(51) Int. Cl.
*G10L 19/22* (2013.01)
*G10L 25/18* (2013.01)
*H03M 1/12* (2006.01)

(52) U.S. Cl.
CPC ..................................... *H03M 1/12* (2013.01)

(58) Field of Classification Search
CPC .... H04S 7/305; H03G 5/165; H03H 21/0012; H04R 29/001; H04R 3/04
USPC ........... 704/203; 375/240.26, 240.01; 381/97, 381/119, 61; 700/94
See application file for complete search history.

(56) References Cited

U.S. PATENT DOCUMENTS

| | | | |
|---|---|---|---|
| 7,079,657 B2 * | 7/2006 | Wu et al. | 381/2 |
| 8,320,584 B2 * | 11/2012 | Sheets | 381/97 |
| 8,665,966 B2 * | 3/2014 | Tsukagoshi et al. | 375/240.26 |

* cited by examiner

*Primary Examiner* — Charlotte M Baker
(74) *Attorney, Agent, or Firm* — Blakely, Sokoloff, Taylor & Zafman LLP (57) ABSTRACT

Reduced digital audio sampling rates are described in a digital audio processing chain. In one embodiment, an audio signal is received. A convolution operation is performed on the received audio signal. The convoluted audio signal is sampled. An interrupt is received to process the audio sample, and the sample is processed in response to the interrupt. The processed samples are collected to form a frame and the frame is transmitted to a remote device.

17 Claims, 6 Drawing Sheets

REDUCED DIGITAL AUDIO SAMPLING RATES IN DIGITAL AUDIO PROCESSING CHAIN

FIELD

The present disclosure relates to analog to digital converters and in particular to reducing the sampling rate in a digital audio processing chain.

BACKGROUND

Mobile devices frequently offer voice or audio communication systems so that users can communicate through a network with other users. Cellular telephones may offer voice communication using a cellular telephone network or the Internet. Other devices may use other networks to send and receive voice to remote devices. These systems use digital communication networks so that a downlink chain receives digital speech from the network, converts it to analog, and plays it through a speaker. An uplink chain receives speech through microphones, converts it to digital speech using an analog to digital converter (ADC) and sends the digital speech to the network. The digital speech from the ADC is in the form of discrete samples which are processed as samples and then packetized by being accumulated and attached to a packet header to be sent on the network. The same system is also used in some systems for audio and video recordings that are stored at the device.

The ADC in the uplink chain samples the speech to produce the digital speech. The sample rate and the number of bits per sample determine the quality of the digital conversion. For many systems an 8 kHz sample rate is used. If the analog audio is low pass filtered to include no audio frequencies higher than 4 kHz, then the Nyquist criterion is satisfied. Higher fidelity speech is currently being investigated for which higher audio frequencies are included in the digitized speech. The 4 kHz low pass filtered speech has been referred to as Narrowband Speech and 8 kHz low pass filtered speech is referred to as Wideband Speech. Super Wideband Speech uses a 16 kHz low pass filter. These higher frequency analog audio signals require higher sampling rates if the Nyquist criterion is to be satisfied.

In typical present day mobile audio and systems, almost all audio processing chains are driven by interrupts, typically from an AFE (Audio Front End). For each of these interrupts, the AFE periodically extracts a sample from the ADC of the microphone and feeds the sample through the uplink speech processing chain. This is followed by extracting a sample from the downlink speech processing chain to a loudspeaker or other interface. As a result, the sampling rate requirement of the ADC is directly related to the interrupt rate of the AFE. A higher speed ADC requires a higher interrupt rate at the audio scheduler. The audio scheduler schedules the various audio processing blocks in a typical mobile audio processing pipeline. Doubling or quadrupling the sampling rate requires that more computational resources are used for processing speech samples and frames.

Typically a real-valued speech signal being fed through a speech processing chain in the uplink direction should be sampled at twice its bandwidth. This can be derived according to Nyquist's sampling theorem. For Narrowband Speech, the bandwidth of the speech signal is restricted to 4 kHz in which case the sampling rate of the ADC is 8 kHz. This applies not only to the ADC, but also to the samples supplied to the DAC on the DL and to other interfaces. This provides reciprocity. For Wideband Speech, the bandwidth of speech is restricted to 8 kHz and the sampling rate of the ADC is 16 kHz. The sampling rate of the ADC or the DAC dictates the interrupt rate of the AFE.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

A complexity-scalable audio processing pipeline is described that is particularly useful for mobile devices. The interrupt rate of the AFE and the ADC may be reduced as described herein. This allows for better task scheduling for audio and non-audio tasks that run on the computing cores of the system. The computational complexity of the speech processing chain can also be reduced in both uplink and downlink directions, while the quality of speech is unperturbed.

Using the described techniques, the system requirements to support high speed ADCs with higher sampling rates can be relaxed. This allows simpler lower cost system designs. High fidelity mobile speech processing systems like Super-Wideband (24/32 kHz sampling rates for voice) may be accommodated at less expense because a sub-Nyquist speech signal sampling rate at the ADC may be used.

An analog speech signal is real-valued and not complex-valued. Therefore, it may be represented as a real number with no imaginary part. As a result, the magnitude of the Fourier transform of an analog speech signal is an even function. It is symmetrically arranged about zero frequency. By applying a Hilbert Transformation to the speech signal, the pre-envelope of the signal, which consists of only one side lobe in the frequency domain, may be computed. By transforming the signal into a one-sided analytic signal, the transformed signal can be sampled at half of the original Nyquist rate without the sampled signal being affected by aliasing.

Theoretically, the full band signal can be perfectly reconstructed from the one-sided pre-envelope by taking advantage of the fact that the analog speech signal is a real valued signal. The frequency content (corresponding to one-side) is not cut off by sampling only the pre-envelope and hence Parseval's theorem is not violated. Practically, the quality of the reconstruction of the analog signal is dependent on the precision of the Hilbert Transformer. Generally, higher precision in the transformer requires higher complexity.

In the uplink direction, a Nyquist-rate ADC may be replaced with or modified to act as a half Nyquist rate ADC by processing the pre-envelope instead of the original signal.

Using a half rate ADC, AFE interrupts may be reconfigured to occur at half the rate, for example at each complex sample of the pre-envelope. In the downlink direction, the AFE interrupts may be reconfigured to occur for every two real samples instead of for each real sample. By reducing the sampling rate, the interrupt overhead of the audio scheduler is also reduced, making allowance for more optimized sample-based and frame-based processing. This results in a substantial gain in the availability of the computational resources for other functions. As microphones and ADCs are used for higher bandwidth voice applications, such as 24/32 kHz sampling rates, higher processing power is required. The half-rate sampling described herein is not half-rate streaming. The audio is processed full rate, but in a more efficient way.

Besides sampling the pre-envelope at the ADC, the AFE interrupts may also be reconfigured to occur once every two or four or more complex samples instead of once every complex sample. The sample-based processing may be altered to handle more than one complex sample at a time so that the interrupts are even less frequent. This may further reduce the overall interrupt overhead.

With half Nyquist-rate sampling, there is a drastic reduction of the interrupt overhead for an audio scheduler in the speech processing chain. This may occur in both the uplink and the downlink directions, allowing for better scheduling for all interrupt-based tasks (audio as well as non-audio) which run on the computing cores in typical mobile SOCs. Sample-based and frame-based processing are also optimized, thus gaining a computational advantage. These benefits are a result of cutting the sampling rate requirement of the ADC in half compared to Nyquist rate ADCs. In some cases high-speed ADCs may also be avoided.

In addition, half Nyquist-rate sampling may be used as a power saving technique. A system may operate normally with full Nyquist-rate sampling, but when a battery-powered device is on low battery, the system may switch to half Nyquist-rate sampling. Better speech quality may be generated without compromising on the choice of audio algorithms. Alternatively, half Nyquist-rate sampling may be used at all times, but when the battery is low, the system may reduce the low-pass filter frequency together with the sampling rate thus going below half-Nyquist rate sampling to 1/n-Nyquist rate sampling (n>2). By limiting the highest frequency to be transmitted and then applying a Hilbert Transformation to the speech with one-sided sampling, better speech quality can be ensured without limiting the algorithms in the processing chain.

As an example, when the mobile determines that it is running low on battery, an alert may be generated for the ADCs. Instead of compromising on the choice of speech processing algorithms to be used, the ADC operation can be switched over to the efficient sub-Nyquist sampling described herein. The sampling may range from a full reconstruction at half-Nyquist sampling rate to a partial reconstruction at lower than half-Nyquist sampling rate. In each case better speech quality is provided than with a conventional ADC at the same sampling rate.

A lower sample rate processing is an extension of the half-rate sampling described herein to cover cases where sufficient processing capability or sufficient power is not available. Instead of fully turning off the speech processing modules or turning off other critical processing modules in the speech processing chain, the processing requirements may be scaled back. This may allow a conversation or other use of the device to continue longer before the battery is exhausted.

Figure 1:
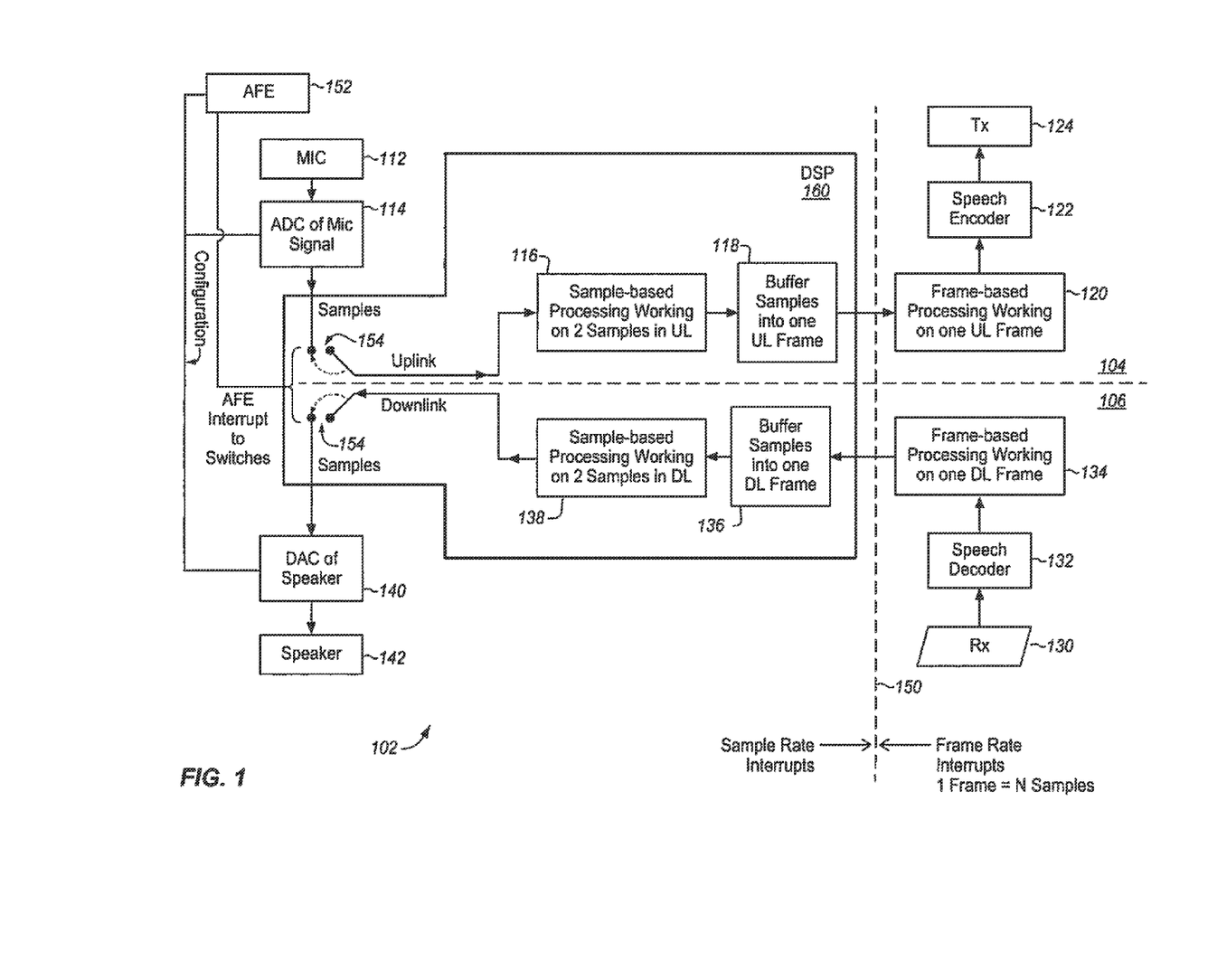
FIG. 1 is a block diagram of an audio pipeline according to an embodiment.

FIG. 1 is a block diagram of an audio pipeline 102. There is an uplink (UL) part 104 of the pipeline and as downlink (DL) part 106 of the pipeline. Such an audio pipeline is typical for a mobile device, such as a smart phone, but may be present in any of a variety of different wearable, portable and fixed devices that send and receive speech or other audio. A similar pipeline may also be present in audio recorders and video cameras.

In the uplink part 104 of the pipeline, speech data is received at one or more microphones 112, is digitized at the ADC 114, and is then fed into the uplink processing path. The uplink processing path has sample-based processing in a block 116, followed by frame-based processing 120. The processed samples are fed to a buffer 118 to be accumulated until there are enough samples for a frame. The frames are then processed 120. The processed frames are sent to a speech encoder 122 and are then sent to the communication DSP 124 (also referred to as a modem DSP) which processes the frames for transmission over radio channels. The nature of the transmitter and how it is controlled depends on the particular interface and protocol for the transmission format.

The DL speech data is processed in the DL path and is finally fed into the loudspeaker 142. The speech data is received from a receiver 130 and then decoded 132. The frame processing block 134 processes the speech frame from the speech decoder and splits the frame into samples which are buffered 136 for processing in a sample processing block 138. The samples are fed to a DAC 140 to be output by the speaker 142. The diagram of FIG. 1 is not complete and there may be many other components in the UL and DL pipeline such as amplifiers, filters, signal processors, and to make up the audio front end (AFE) of a device.

The sample level processing blocks 116, 118 run based on a sample rate while the frame level processing blocks 118, 136 run on a frame rate. The frame rate is a fraction of the sample rate because there are many samples in a frame. FIG. 1 shows a dividing line 150 between blocks that run at a sample rate and blocks that run at a frame rate.

An AFE 152 which may be part of a digital, signal processor (DSP), dedicated logic device, the audio device, or a general or specific microcontroller generates interrupts to drive the sample-based processing 116, 138. The microcontroller may be a central processor for the entire system, a part of a SoC, or a dedicated audio controller, depending on the implementation. The AFE 152 sends interrupts at the sample rate (i.e. the rate at which the ADC samples the pre-envelope) to the sample-based processing modules 116, 138. This may be done in a variety of different ways. In the illustrated embodiment the AFE interrupts the Audio DSP 160 and feeds the UL sample through the UL processing chain. This is represented by the UL switch 154. The actual mechanism for feeding samples to sample-based processing may be adapted to suit any particular configuration. Similar, the AFE interrupts the Audio DSP 160 to feed DL samples to the DAC and speaker.

The frame-based processing modules 120, 134 may be driven by interrupts from the AFE or by the Audio DSP, or in another way. In some embodiments the frame-based processing is triggered after the buffer 118 has accumulated enough samples to form a frame. This may be done by an alert within or coupled to the buffer. The microcontroller may also generate interrupts to drive all of the other processes for the device, depending on the particular implementation.

The AFE 152 also configures the sampling rate of the ADC 114 and optionally the DAC 140. This configuration includes the interval at which the ADC will sample the analog signal from the microphone 112. In some embodiments, the AFE indirectly sets the clock for the ADC. In other embodiments, the AFE directly sets the clock and in other embodiments, the AFE sends interrupts at the sample rate to drive the ADC. In addition to the parameters for the sampling rate, the AFE may also provide other parameters to the ADC and to other components of the UL and DL chains.

For each AFE interrupt, a microphone sample enters the UL chain followed by a sample being fed to the speaker in the DL chain. As mentioned above, the AFE interrupts may be sent from the AFE at the same rate that the ADC samples the audio. For the one-sided pre-envelope sampling described herein, one complex sample (having a real and imaginary part) enters the UL chain followed by two real samples being fed to the DL chain. For each frame interrupt (after a set of AFE interrupts), a frame of samples enters the UL frame-based processing module. After this a frame of samples enters the DL frame-based processing module from the speech decoder.

The structure of the components of FIG. 1 may take many different forms. The microphones 112 are a transducer to convert analog acoustic waves that propagate through the ambient environment and convert these into analog electrical signals. The acoustic waves may correspond to speech, music, noise, machinery or other types of audio. The microphones may include the ADC as a single component or the ADC may be a separate component. The ADC 114 samples the analog electrical waveforms to generate a sequence of samples at a set sampling rate. The sample-based processing 116 may be performed in a DSP (Digital Signal Processor) that may or may not include the ADC and DAC. This audio DSP may also include the frame-based processing 120 or the frame-based processing may be performed by a different component. The interrupts may be generated by an AFE that is included in an audio DSP or the AFE may be a separate component including a general purpose processor that manages different types of processes in addition to audio pipelines.

The AFE (audio frontend) is formed from hardware logic and may also have software components including a counterpart driver. The driver is invoked through a command when a voice call or recording is started. An example command may be labeled as VB_HW_AFE (Voice band Hardware AFE). Such a command may be used to specify the sampling rate used by the ADC 114 and to set up registers for the AFE to use to process the samples. The command may be used to configure the ADC sampling rate or simply to report it to the sample processing blocks. As mentioned above ADC sampling rates may take any desired values. Currently 8 kHz is used for Narrowband Speech, 16 kHz is used for Wideband Speech and 45 kHz is used for audio recording. Higher or lower sampling rates may be used to suit particular applications.

After the ADC 114 starts sampling the analog signal. The digital samples are stored in a buffer 116. After a particular number of samples are buffered, an interrupt is generated by the AFE to the audio DSP to begin the sample-based processing. An example interrupt may be labeled VB_TX (Voice band Transmit). After the sample-based processing, the processed samples are stored in a frame buffer 118.

After a particular number of processed samples are accumulated, then the sample-based processing triggers the DSP to begin the frame-based processing tasks 120. The interrupt rate of the AFE may be reduced by reducing the sampling rate of the ADC. Normally, this would reduce the quality of the sampled speech and violate the Nyquist criterion. However, by computing a pre-envelope of the speech, for example by taking a convolution of the analog real-valued speech signal with an impulse response (time domain filter), the sampling rate may be reduced with no loss in quality. In one example a Hilbert Transformation is applied to the speech signal.

Let $X(t)$ be the real-valued speech signal, and $X_H(t)$ be the Hilbert transformed signal.

The Hilbert transformation may be defined as:

$$X_H(t) = X(t) * (1/\pi t) \quad \text{Eq. 1}$$

where * is a convolution operation.

The equivalent transformation in the frequency domain is expressed as:

$$X_H(f) = [-j \text{sgn}(f)] X(f) \quad \text{Eq. 2}$$

where $X_H(f)$ and $X(f)$ are corresponding continuous time Fourier Transformations of $X_H(t)$ and $X(t)$ respectively and j is $\sqrt{-1}$.

Based on Eq. 2, the pre-envelope $X_+(t)$ of the time domain signal $X(t)$ may be defined as:

$$X_+(t) = X(t) + j X_H(t) \quad \text{Eq. 3}$$

The frequency spectrum of $X_+(t)$ is actually one-sided compared to the two-sided bandwidth of the original speech signal $X(t)$. The frequency spectrum of all the signals may be plotted as shown in FIGS. 2A, 2B and 2C.

Figure 2A:
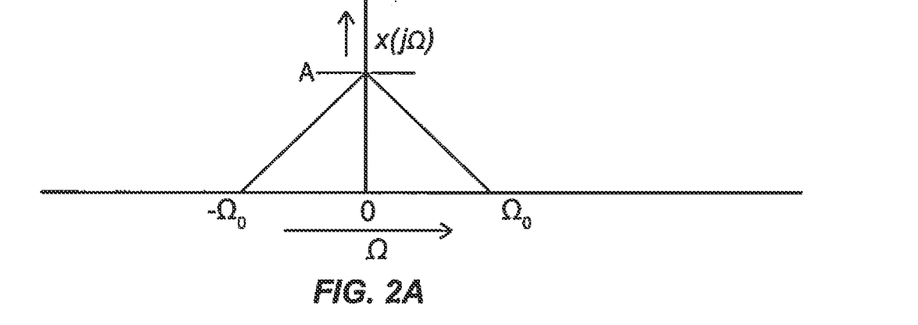
FIGS. 2A to 2C are graphs of audio signals in the frequency domain in different stages of processing according to an embodiment.

FIG. 2A is a representation of $X(t)$ in the frequency domain. FIG. 2B is a representation of the Hilbert transform $X_H(t)$ in the frequency domain and FIG. 2C is a representation of $X_+(t)$ in the frequency domain. While these graphs show the signals in the frequency domain, the processing performed before the ADC is in the time domain. FIG. 3 indicates each of these signals as being functions of time, not frequency.

FIG. 2A is a Fourier Transform representation of the original two-sided frequency bandwidth of the initial analog speech signal $X(t)$, wherein $X(j\Omega)$ represents the frequency amplitude X as a function of the frequency $\Omega$. In the theoretical representation of the input speech in the frequency domain, the signal is clearly two-sided where the amplitude A of the frequency spectrum of the speech on the vertical axis is plotted against frequency on the horizontal axis. The maximum amplitude is indicated as "A" at $\Omega=0$.

Figure 2B:
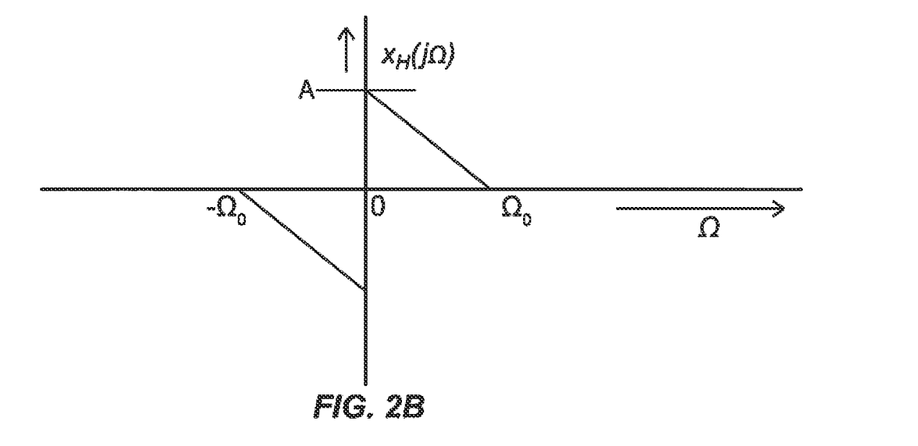
Figure 2C:
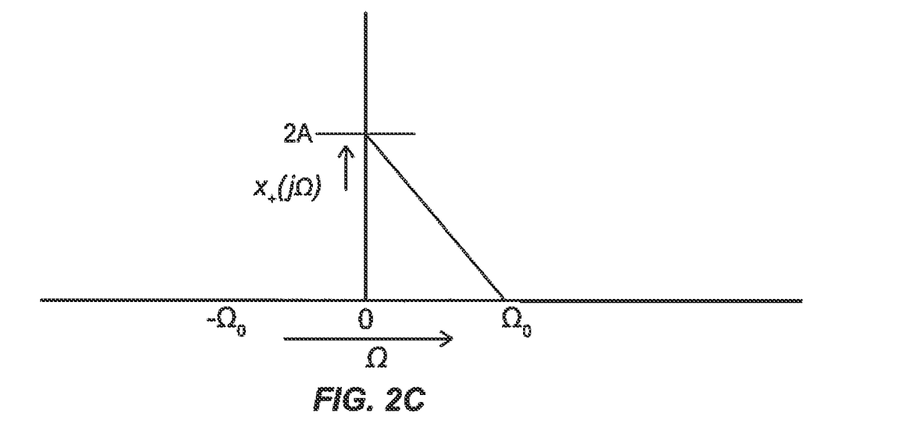
Figure 3:
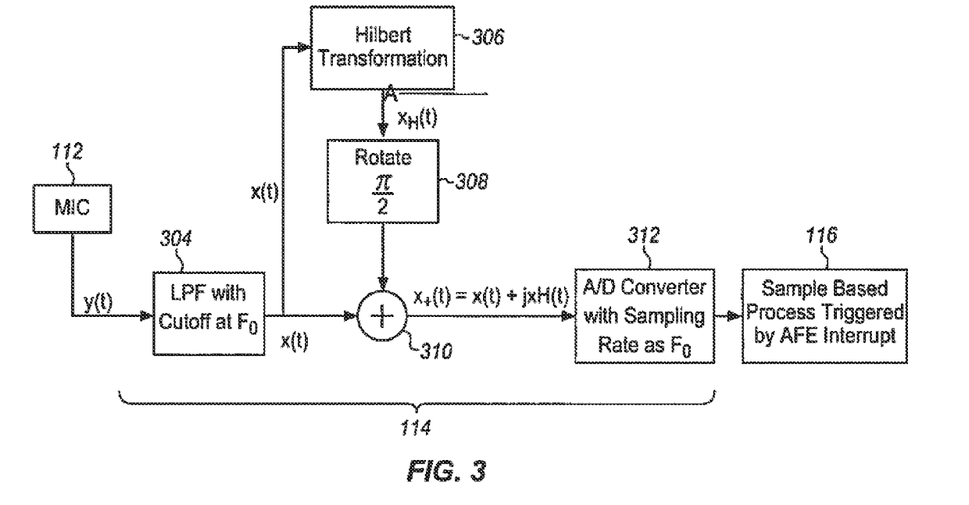
FIG. 3 is a block diagram of a pre-envelope computation module before analog to digital conversion for an uplink speech scheduler according to an embodiment.

FIG. 2B shows the Hilbert transformation $X_H(t)$ of the input signal $X(t)$ as a function of the frequency spectrum of the signal in which $X_H(j\Omega)$ represents the frequency amplitude $X_H$ of the Hilbert transformation as a function of the frequency $\Omega$ in the frequency domain.

FIG. 2C shows the pre-envelope of the signal obtained by adding the values of FIGS. 2A and 2C. The resulting signal has twice the amplitude "2A" at $\Omega=0$ but is one-sided.

The Fourier Transform of $X_+(t)$ may be given by $X_+(f)$ as:

$$X_+(f); f \geq 0 \quad \text{Eq. 4}$$

$$X_+(f) = 0; f < 0 \quad \text{Eq. 5}$$

As a result of equations 4 and 5, by computing the pre-envelope, the real speech signal is converted into an analytic signal which has only one side band. The pre-envelope of the signal can be sampled at half of the Nyquist rate of the original signal and still avoid aliasing.

Using this pre-envelope, the sampling rate requirement for the real valued signal is half that of the original signal. If the bandwidth of the real-valued speech signal is W, then its Nyquist sampling rate is 2 W. The corresponding minimum sampling rate without any aliasing for its pre-envelope is W.

In some embodiments, the pre-envelope signal is processed throughout the speech processing chain instead of the original signal. As the interrupt rate of the AFE comes down by a factor of 2, the interrupt overhead comes down by a factor of 2. The time interval between successive interrupts is then doubled, allowing more leeway for the tasks of the audio subsystem. Along with this, it is possible for much better scheduling of other tasks (both audio as well as non-audio, general purpose tasks) from the overall system viewpoint.

FIG. 3 is a block diagram of an uplink ADC 114 for performing the example pre-envelope processing described above. The speech or other audio is received at a microphone 112, passed through the ADC 114, and forwarded to the sample processing 116 as in FIG. 1. The incoming analog electrical audio signal, such as a speech signal, from the microphone is applied to a low pass filter 304. The cutoff frequency $F_0$ for the filter may be adapted to suit any desired application. For Narrowband Speech the cutoff frequency is 4 kHz. The filtered audio corresponds to the input speech signal X(t) discussed above and represented in FIG. 2A.

A Hilbert transformation is applied at a block 306 to produce the signal $X_H(t)$ represented in FIG. 2B. This signal may be rotated 90° or π/2 at 308 and then combined in a combiner 310 with the original speech signal. The result of these operations is the pre-envelope signal $X_+(t)$ represented in FIG. 2C. The pre-envelope signal may then be digitized in an ADC 312 at the same sampling rate e.g. 4 kHz as the cutoff frequency $F_0$. The digital signal is then applied to the sample-based processes in a processing block 116.

Each complex sample of the pre-envelope passes through the sample-based processing chain at each AFE interrupt. The sample-based processing chain can be optimized to work on one complex sample at a time, instead of one real sample. As described above, a complex sample corresponds to two real samples. The loops inside the sample-based processing can be tailored to handle one complex sample instead of one real sample resulting in an optimized and computationally efficient implementation.

By processing one complex sample and two real samples at a time in both the uplink and the downlink directions respectively, the interrupt overhead is reduced in the context of an audio scheduler. This allows for better scheduling in the whole system. A more efficient audio pipeline, including the sample-based and frame-based processing can be realized.

In the downlink direction, the sample-based processing 138 of the downlink chain 106 may be modified to work on two real samples at a time and feed out two real samples to the speaker for each AFE interrupt. In the frame-based processing 120, 134 parts of the chains 104, 106, no significant new techniques are required. For Acoustic Echo Cancellation (AEC), for example, the pre-envelope of the reference line may be fed to AEC processing without any changes to the AEC processing. Similarly, with spectral-domain techniques like TNR (Traffic Noise Reduction), WNR (Wind Noise Reduction), NR (Noise Reduction), SER (Spectral Echo Reduction) etc., the sizes of the FFT may be reduced by a factor of 2, providing a computational gain. The efficient implementation of sample-based and frame-based processing can be effortlessly adapted to parallel architectures.

Figure 4A:
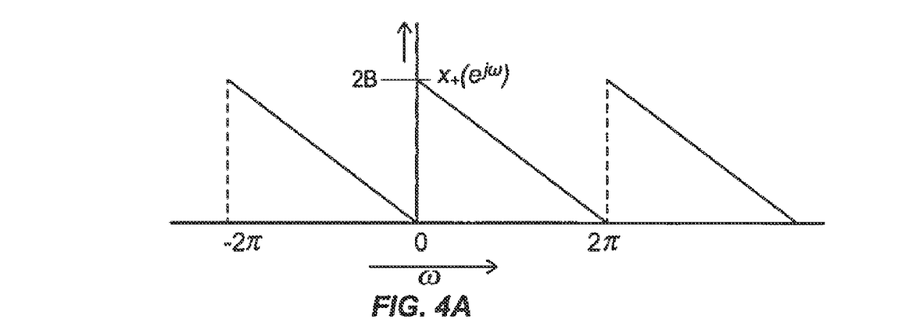
FIGS. 4A and 4B show audio reconstruction according to an embodiment.

It can be shown that the digital signal generated as shown in FIG. 3 contains all of the information from the original real-valued time domain speech or audio signal. One example of how this can be shown is to reconstruct the original signal from the digital samples. This is described in the context of FIGS. 4A and 4B. Before the speech encoder 122 in the UL, the original real signal from the pre-envelope can be reconstructed by taking advantage of the symmetry of the Fourier Transform of a real signal. Defining $X_+(n)$ to be the complex samples of the pre-envelope, the DTFT (Discrete-Time Fourier Transform) of, $X_+(n)$ and X(n) may be represented as shown in FIG. 4A. In FIG. 4A, the vertical axis corresponds to the amplitude of the transform $X_+(e^{j\omega})$ plotted against discrete-frequency ω on the horizontal axis. The signal has a cycle period of 2π, and a maximum amplitude of "2B."

Figure 4B:
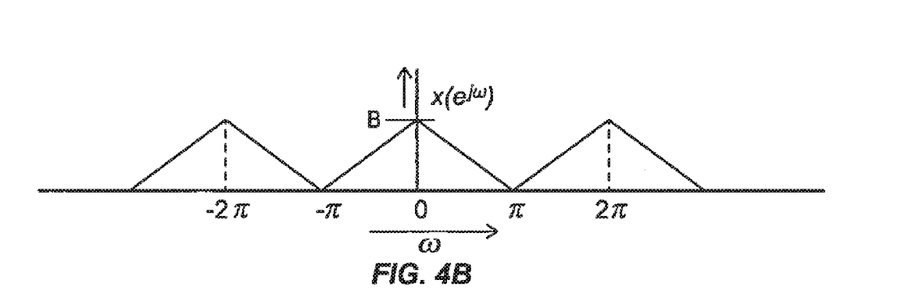

This sample sequence may be processed by inserting as "0" between every 2 samples of $X_+(n)$. The spectrum from [π, 2π] portion may then be manipulated to represent the complex conjugate of [0, π]. By this process, the original spectrum is reconstructed. After taking the IFFT (Inverse Fast Fourier Transform) the time-domain signal may be reconstructed as shown in FIG. 4B. In FIG. 4B, the amplitude of the manipulated spectrum $X(e^{j\omega})$ is represented on the same frequency domain with half the maximum amplitude "B." As shown and in contrast to the one-sided signal bandwidth of FIG. 4A, FIG. 4B shows a two-sided signal bandwidth with half the amplitude.

The techniques described above may be extended to provide for low rate sampling not just of one half of a normal sampling rate but of many different sampling rates. The techniques described herein may be used to support any of a variety of different sampling rates and the sampling rate may be changed to adapt to different operating circumstances.

For the minimum possible sampling rate, the cutoff frequency $F_0$ of the LPF 304 may be modified to suit operating circumstances as well. Lowering the LPF cutoff frequency allows for a lower sampling rate which reduces the demand on system resources. These resources may be used for other tasks or total power consumption may be reduced.

Variable sampling rates may be used to reduce overall power consumption based on system demand. A system may generate an alert when battery power is low. The alert from a power management system, for example, may be used to trigger a lower sampling rate at the AFE. This technique may be used during low-battery situations to provide for better power management with only a small compromise on the speech quality.

At times of low battery power, the cutoff frequency of the LPF may be reduced e.g. from Wideband to Narrowband Speech or from Narrowband to some lower level such as 3 kHz or 2 kHz. This may be done instead of, or in addition to, turning off some of the processes in the sample/frame processing part of the audio pipeline. By choosing a lower cutoff frequency and then processing the pre-envelope rather than the original signal at a lower sampling rate, power consumption can be reduced.

In a typical system, a lower sampling rate reduces power consumption. As a result, other processes in the pipeline may be maintained while still conserving power resources. As a result, use of the Hilbert Transform to process a pre-envelope of the audio may be used to support a variable cutoff frequency. This results in better speech quality during low battery times. As an example, the sampling rate may be reduced in order to allow other processing to continue at maximum or high levels. This extends the battery life with a small cost in speech quality. In another example with still less available power, instead of simply shutting down, the system may be able to operate in a lower power, lower sampling rate mode without any of the sample processing being performed. There may be multiple tiers so that as power is further exhausted, the cutoff frequency and the sampling rate can be reduced in stages or steps until the speech quality reaches a level that is no longer useable or satisfying. The system may then shut down or go to standby mode.

Figure 5:
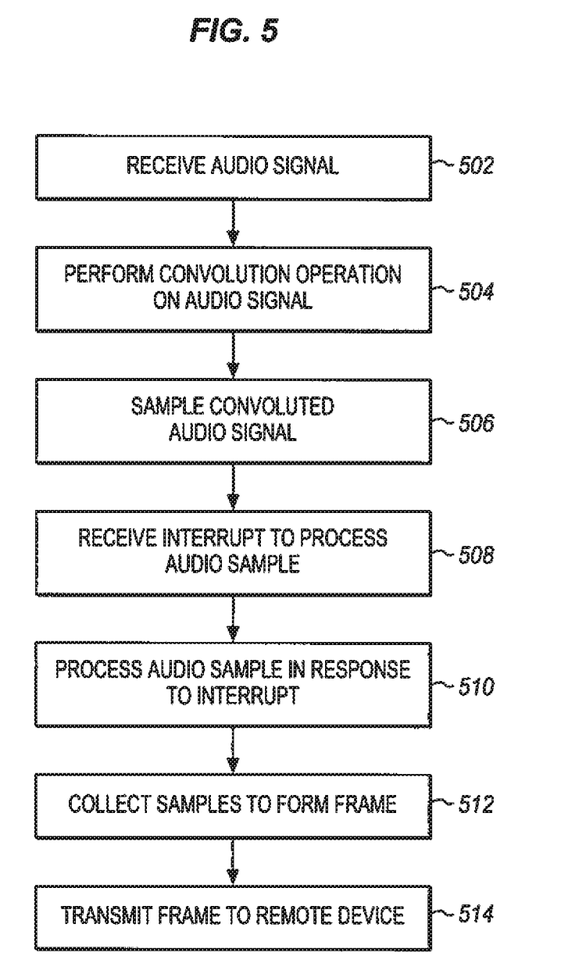
FIG. 5 is a process flow diagram of sampling audio in an audio pipeline according to an embodiment.

FIG. 5 is a process flow diagram for sampling audio at a lower rate as described above. At 502, an audio signal such as speech is received. This signal is a real-valued analog electrical signal. At 504, a convolution operation is performed on the audio signal. The convolution operation may be a Hilbert transformation or a similar type of transformation. The convolution may include computing a pre-envelope for the audio signal in which the Hilbert transformation is rotated and then combined with the original time domain signal. The pre-envelope is sampled at 506. The parameters for the sampling including the sampling rate may be received from an AFE or another component. At 508 an interrupt is received from another component, for example an AFE by a sample processor to process the audio sample. At 510 the Audio DSP or similar component processes the audio signal in response to the interrupt. At 512, the samples are collected to build a frame and at 514 the frame is transmitted to a remote device, such as a portable communications terminal or a memory. There may be various processing operations performed on the frame before the frame is sent, depending on the particular implementation.

Figure 6:
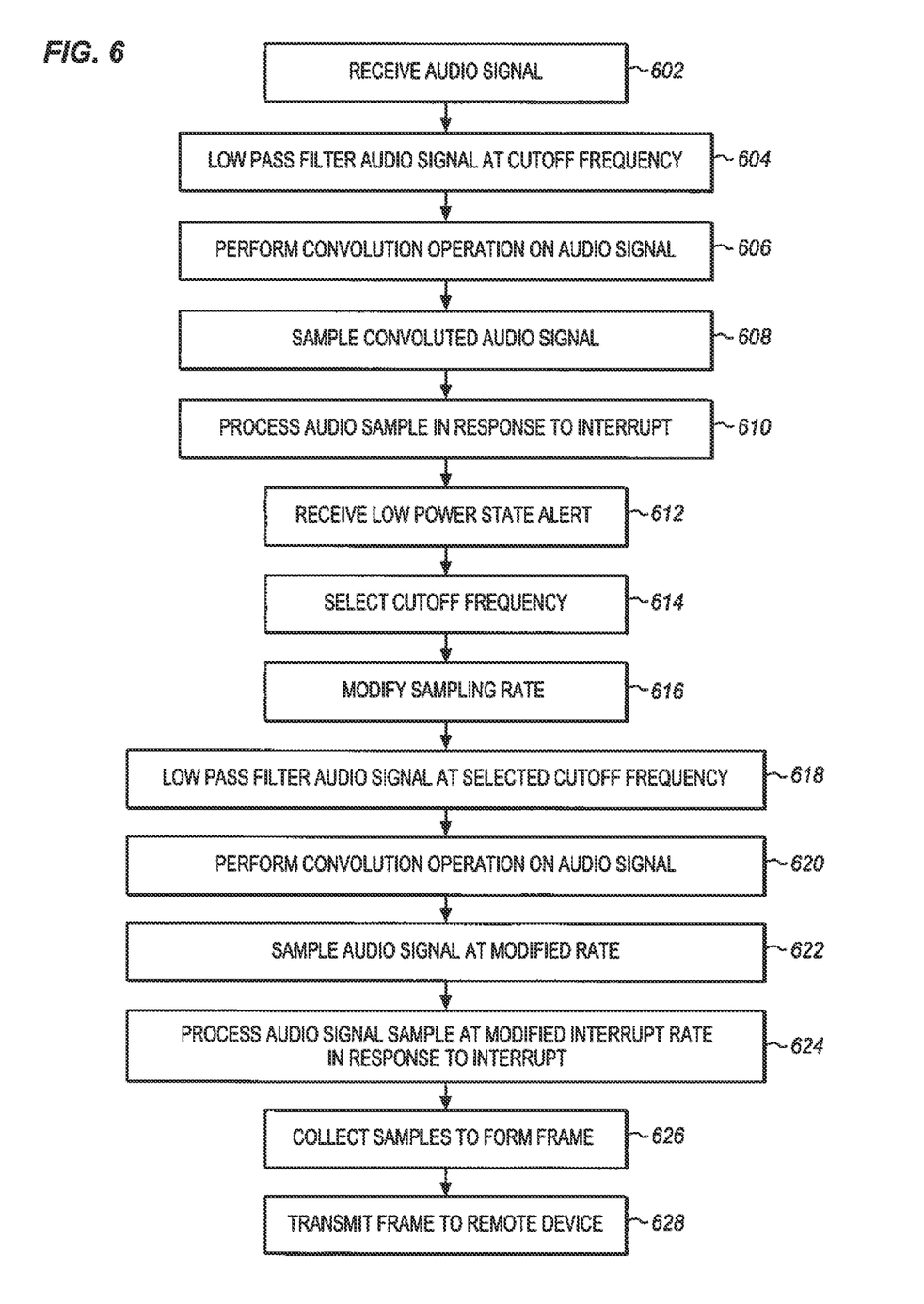
FIG. 6 is a process flow diagram of power management for an audio pipeline according to an embodiment.

FIG. 6 is a process flow diagram of power management for a portable device with an audio pipeline. The system such as that of FIGS. 3 and 5 is operating normally so that it receives an audio signal at 602. The audio signal is low pass filtered at a cutoff frequency $F_0$ at 604. A convolution operation such as a Hilbert transform followed by a pre-envelope calculation is performed on the audio signal at 606. The ADC samples the audio signal at a particular sampling rate at 608. The sampling rate is related to the low pass filter cutoff frequency and is normally the same frequency as described above. However, it could be a higher or lower frequency, depending on the particular implementation. At 610, the audio sample is processed at a rate that corresponds to the particular sampling rate. This sample-based processing is performed in response to an interrupt.

At 612 a low power state alert is received from the power management system. This alert may take a variety of different forms and may be received at the microcontroller for the system or for the AFE or it may be received at the AFE. The alert may be in response to a low battery, a reduced available power, other processes that demand processing resources, or any other condition of the device. In response to this alert, a cutoff frequency is selected at 614 and the sampling rate is modified at 616.

Following these changes, the low pass filter filters the audio signal at the selected cutoff frequency at 618. At 620 the convolution operation is performed on the signal with the lower frequency cutoff. The ADC samples the audio signal at the modified rate at 622. At 624, the audio sample is processed in response to an interrupt. The interrupts are provided at a lower rate based on the lower sampling rate. The processed samples are collected at 626 to form a frame and the frame is transmitted to a remote device at 628.

Figure 7:
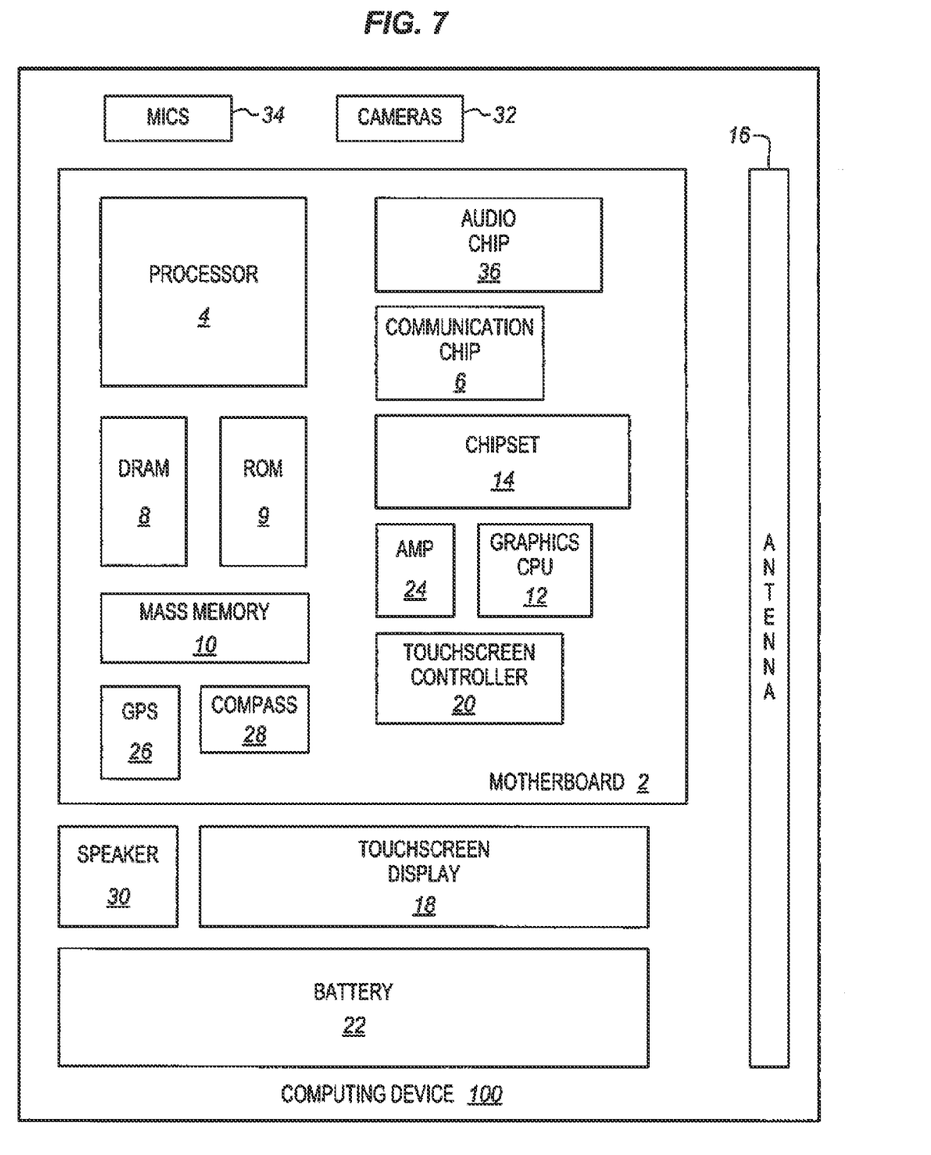
FIG. 7 is a block diagram of a computing device incorporating audio processing according to an embodiment.

FIG. 7 illustrates a computing device 100 in accordance with one implementation. The computing device 100 houses a system board 2. The hoard 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, a microphone array 34, and a mass storage device such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth. Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The microphones 34 and the speaker 30 are coupled to one or more audio chips 36 to perform digital conversion, encoding and decoding, and sample-based processing as described herein. The processor 4 is coupled to the audio chip, through an audio front end, for example, to drive the process with interrupts, set parameters, and control operations of the audio chip. Frame-based processing may be performed in the audio chip or hi the communication package 6. Power management functions may be performed by the processor, coupled to the battery 22 or a separate power management chip may be used.

In various implementations, the computing device 100 may be a laptop, a netbook, a notebook, an ultrabook, as smartphone, a wearable device, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device may be fixed, portable, or wearable. In further implementations, the computing device 100 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method that includes receiving an audio signal, performing a convolution operation on the audio signal, sampling the convoluted audio signal, receiving an interrupt to process a sample of the audio signal, processing a sample in response to the interrupt, collecting the samples to form a frame, and transmitting the frame to a remote device.

In further embodiments, the convolution operation is a Hilbert transformation.

Further embodiments include computing a pre-envelope of the audio signal after performing a convolution and before sampling.

In further embodiments, computing a pre-envelope comprises combining a rotated Hilbert transformation of the audio signal with the audio signal.

In further embodiments, the pre-envelope is a complex value with only one side lobe in the frequency domain.

Further embodiments include applying a low pass filter to the audio signal before performing the convolution operation.

In further embodiments, the audio signal is a real-valued signal and wherein sampling comprises sampling a complex-valued result of the convolution operation.

Further embodiments include receiving a low power state alert and modifying the sampling rate to reduce power consumption, wherein sampling the audio signal comprises sampling the audio signal at the modified sampling rate.

Further embodiments include applying as low pass filter to the received audio signal, the low pass filter having a cutoff frequency selected in response to the low power state alert, and the modified sampling rate being no higher than the cutoff frequency.

In further embodiments the low pass filter has a cut off frequency and wherein sampling the audio signal comprises sampling at a rate that is lower than the cut off frequency in further embodiments, sampling the audio signal comprises sampling at a sampling rate that is below the Nyquist sampling rate of the audio signal.

Some embodiments pertain to an audio processor that includes a low pass filter having a cutoff frequency to filter received audio, a Hilbert transformer to apply a Hilbert transformation to the filtered audio, a combiner to combine the Hilbert transformation with the filtered audio to form a combined audio signal, and an analog to digital converter to sample the combined audio signal.

In further embodiments, the analog to digital converter samples the combined audio at a rate that is not higher than the cutoff frequency.

Further embodiments include a buffer to receive the samples and buffer the samples for sample-based audio processing. Further embodiments include an audio front end to configure a sampling rate of the analog to digital converter. Further embodiments include a signal rotator to rotate the Hilbert transformation before combining.

Further embodiments include a packetizer to collect samples and convert them to packets for transmission to an external source.

Some embodiments pertain to a portable audio device that includes a battery to power the device, a downlink pipeline having a digital to analog converter to receive audio data from an external source and to convert the speech data to analog electrical audio, an amplifier to amplify the downlink audio, and a speaker to convert the downlink audio to sound waves, an uplink pipeline having a microphone to receive sound waves from a user of the device, an amplifier to amplify the received sound waves as an analog electrical signal, and an analog to digital converter to convert the analog electrical audio to uplink audio data for transmission to the external source, and a transceiver to send and receive frames through a wireless communications link to the external source, wherein the analog to digital converter comprises a low pass filter having a cutoff frequency, a convolution operator to convolve the analog electrical signal and wherein the analog to digital converter samples the convolved signal at a sampling rate no higher than the cutoff frequency.

Further embodiments include an audio processor to process the uplink audio samples, in response to interrupts, and a processor to generate the interrupts to the audio processor.

Further embodiments include a packetizer to collect samples and convert them to packets for transmission to the external source.

What is claimed is:

1. An audio processor comprising:
   a low pass filter having a cutoff frequency to receive an analog audio signal and filter the received audio below the cutoff frequency;
   a transformer to apply a convolution operation to the filtered audio;
   a rotator to apply a rotation to the convolution of the filtered audio;
   a combiner to combine the rotation of the convolution of the filtered audio with the filtered audio to form a combined audio signal that is a pre-envelope of the received audio signal; and
   an analog to digital converter to sample the combined audio signal.

2. The audio processor of claim 1, wherein the analog to digital converter samples the combined audio at a rate that is not higher than the cutoff frequency.

3. The audio processor of claim 1, further comprising a buffer to receive the samples and buffer the samples for sample-based audio processing.

4. The audio processor of claim 1, further comprising an audio front end to configure the sampling rate of the analog to digital converter.

5. The audio processor of claim 1, further comprising a packetizer to collect samples and convert them to packets for transmission to an external source.

6. The audio processor of claim 1, further comprising a microphone coupled to the low pass filter to convert sound into the received analog audio signal.

7. The audio processor of claim 1, wherein sample rate of the converter is below the Nyquist sampling rate of the audio signal.

8. The audio processor of claim 1, further comprising an audio front end to send a low power state alert to the converter, and wherein the converter lowers the sampling rate to reduce power consumption in response to the alert.

9. The audio processor of claim 8, wherein the low pass filter increases the cutoff frequency in response to the alert.

10. The audio processor of claim 1, wherein the convolution operation is a Hilbert transformation.

11. The audio processor of claim 1 wherein the transformer operates on two real samples of the filtered audio per cycle.

12. The audio processor of claim 1, wherein the pre-envelope consists of a single side lobe in the frequency domain.

13. The audio processor of claim 1, wherein the transformer takes a convolution of the filtered analog audio with an impulse response.

14. The audio processor of claim 1, wherein the audio signal is a real-valued signal and wherein the converter samples a complex-valued result of the combiner.

15. A portable audio device comprising:
a battery to power the device;
a downlink pipeline having a digital to analog converter to receive audio data from an external source and to convert the speech data to analog electrical audio, an amplifier to amplify the downlink audio, and a speaker to convert the downlink audio to sound waves;
an uplink pipeline having a microphone to receive sound waves from a user of the device, an amplifier to amplify the received sound waves as an analog electrical signal, and the audio processor of claim 1 to convert the analog electrical audio to uplink audio samples for transmission to the external source; and
a transceiver to send and receive frames of the uplink audio samples through a wireless communications link to the external source.

16. The device of claim 15, further comprising:
an audio processor to process the uplink audio samples, in response to interrupts; and
a processor to generate the interrupts to the audio processor.

17. The device of claim 15, further comprising a packetizer to collect samples and convert them to packets for transmission to the external source.

* * * * *